United States Patent
Lu et al.

(10) Patent No.: US 8,581,322 B2
(45) Date of Patent: Nov. 12, 2013

(54) NONVOLATILE MEMORY DEVICE AND METHOD FOR MAKING THE SAME

(75) Inventors: Chi-Pin Lu, Hsinchu County (TW); Jung-Yu Hsieh, Hsinchu (TW); Ling-Wuu Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/170,618

(22) Filed: Jun. 28, 2011

(65) Prior Publication Data

US 2013/0001667 A1    Jan. 3, 2013

(51) Int. Cl.
*H01L 29/788* (2006.01)

(52) U.S. Cl.
USPC ........... 257/315; 257/316; 257/317; 257/321; 438/424; 438/587

(58) Field of Classification Search
USPC .................. 257/316, 317, 321; 438/424, 587
See application file for complete search history.

(56) References Cited

U.S. PATENT DOCUMENTS

| | | | | |
|---|---|---|---|---|
| 7,445,997 B2* | 11/2008 | Lee et al. | | 438/260 |
| 7,585,729 B2* | 9/2009 | Baek et al. | | 438/261 |
| 7,595,522 B2* | 9/2009 | Takeuchi | | 257/298 |
| 7,803,691 B2* | 9/2010 | Kim | | 438/424 |
| 7,838,404 B2* | 11/2010 | Takeuchi | | 438/587 |
| 7,915,124 B2* | 3/2011 | Kai et al. | | 438/261 |
| 7,919,809 B2* | 4/2011 | Lee et al. | | 257/316 |
| 8,134,199 B2* | 3/2012 | Takeuchi | | 257/316 |
| 8,207,036 B2* | 6/2012 | Purayath et al. | | 438/266 |
| 8,212,303 B2* | 7/2012 | Sakamoto | | 257/314 |
| 2008/0142870 A1* | 6/2008 | Watanabe | | 257/316 |
| 2008/0277714 A1* | 11/2008 | Kim | | 257/321 |
| 2009/0305491 A1* | 12/2009 | Takeuchi | | 438/587 |
| 2010/0006915 A1* | 1/2010 | Lee et al. | | 257/315 |
| 2010/0009503 A1* | 1/2010 | Kai et al. | | 438/257 |
| 2010/0240193 A1* | 9/2010 | Kim | | 438/424 |
| 2011/0001180 A1* | 1/2011 | Masuda et al. | | 257/321 |
| 2011/0024824 A1* | 2/2011 | Shimura et al. | | 257/324 |
| 2011/0042737 A1* | 2/2011 | Takeuchi | | 257/316 |
| 2011/0169068 A1* | 7/2011 | Lee et al. | | 257/321 |
| 2011/0193151 A1* | 8/2011 | Sakamoto | | 257/316 |
| 2012/0132980 A1* | 5/2012 | Takeuchi | | 257/316 |

* cited by examiner

*Primary Examiner* — Julio J Maldonado
*Assistant Examiner* — Jaehwan Oh
(74) *Attorney, Agent, or Firm* — Volpe and Koenig, P.C.

(57) ABSTRACT

A method for making a nonvolatile memory device includes the following steps. A conductive structure is formed, wherein the conductive structure has a first top portion. The first top portion is converted into a second top portion having a domed surface.

11 Claims, 7 Drawing Sheets

NONVOLATILE MEMORY DEVICE AND METHOD FOR MAKING THE SAME

FIELD OF THE INVENTION

The present invention relates a memory device and a method for making the same, and more particularly to a nonvolatile memory device and a method for making the same.

BACKGROUND OF THE INVENTION

In the prior art, a nonvolatile memory device includes a substrate, a floating gate, a control gate and an insulator. The insulator is disposed between the substrate and the control gate, and the floating gate is buried in the insulator. The insulator includes a tunnel oxide layer and an inter-poly dielectric layer. The tunnel oxide layer is disposed between the substrate and the floating gate, and the inter-poly dielectric layer is disposed between the floating gate and the control gate.

Employing the manufacturing process below 20 nm technology node, a floating-gate memory cell having the structure described above is produced. The floating-gate cell suffers a high inter-poly dielectric leakage current associated with the field crowding effects on the edges of the floating gate. A serious inter-poly dielectric leakage current results in a small program window and poor endurance, and reduces the data retention of the flash memory.

SUMMARY OF THE INVENTION

It is therefore an embodiment of the present invention to provide a method for making a nonvolatile memory device. The method includes the following steps. A conductive structure is formed, wherein the conductive structure has a first top portion. In addition, the first top portion is converted into a second top portion having a domed surface.

It is therefore another embodiment of the present invention to provide a method for making a nonvolatile memory device. The method includes the following steps. A transistor workpiece and a conductive layer disposed in the transistor workpiece are formed. In addition, a top surface of the conductive layer is formed, wherein the top surface has a minimum fitted curvature radius being finite.

It is therefore still another embodiment of the present invention to provide a nonvolatile memory device. The nonvolatile memory device includes a transistor structure and a conductive layer. The conductive layer is disposed in the transistor structure, and has a top surface, wherein the top surface has a minimum fitted curvature radius being finite.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

Embodiments of the present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
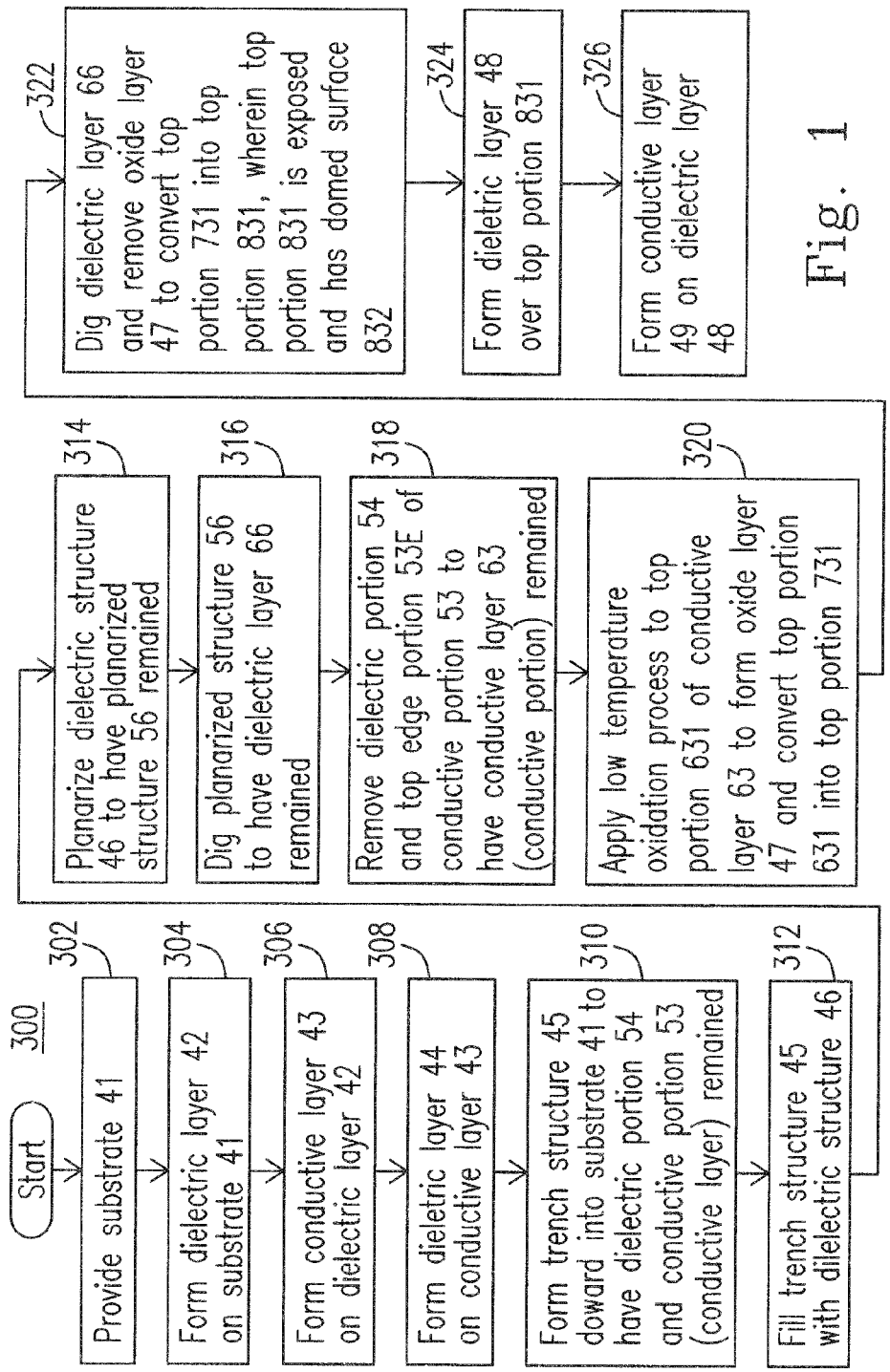
FIG. 1 is a flow diagram showing a method for making a nonvolatile memory device according to one embodiment of the present invention.

Please refer to FIG. 1, which is a flow diagram showing a method 300 for making a nonvolatile memory device according to one embodiment of the present invention, wherein the detailed illustrations for the method 300 are shown in FIG. 2A, FIG. 2B, FIG. 2C, FIG. 2D, FIG. 2E and FIG. 2F. The following descriptions for the flow in FIG. 1 refer to making one of a plurality of nonvolatile memory cell. In step 302, a substrate 41 is provided, and includes a substrate portion 411 and a substrate portion 51. For instance, the substrate 41 is a semiconductor substrate, such as a silicon substrate. In step 304, a dielectric layer 42 is formed on the substrate 41, and includes a dielectric portion 421 and a dielectric portion 52. For instance, the dielectric layer 42 is an oxide layer, such as a SiO2 layer.

In step 306, a conductive layer 43 is formed on the dielectric layer 42, and includes a conductive portion 431 and a conductive portion 53. For instance, the conductive layer 43 is a polysilicon layer. In step 308, a dielectric layer 44 is formed on the conductive layer 43, and includes a dielectric portion 441 and a dielectric portion 54. For instance, the dielectric layer 44 is a hard mask layer. The dielectric layer 44 may be a Si3N4 layer.

In step 310, the dielectric layer 44 is patterned, and a self-aligned shallow trench isolation (SA-STI) process is applied to form a trench structure 45. The trench structure 45 extends downward through the dielectric layer 44, the conductive layer 43, the dielectric layer 42 into the substrate 41. For instance, the dielectric layer 44 is configured to have a masked region and a non-masked region on the dielectric layer 44. The SA-STI process forms the trench structure 45 in the non-masked region. The trench structure 45 is used to separate memory cell regions. Through step 310, the trench structure 45 is formed by removing the dielectric portion 441, the conductive portion 431, the dielectric portion 421 and the substrate portion 411 to have the dielectric portion 54, the conductive portion 53, the dielectric portion 52 and the substrate portion 51 remained. The dielectric portion 54 and the conductive portion 53 (being a conductive layer) may serve as a mask layer and a floating-gate layer, respectively. The dielectric portion 52 and the substrate portion 51 may form a tunnel layer and a substrate of the nonvolatile memory device, respectively.

In step 312, a dielectric structure 46 is formed to fill the trench structure 45. For instance, the dielectric structure 46 is a filler dielectric and includes an optional liner oxide layer 46A and a filler oxide 46B. The filler oxide may be formed by employing a high density plasma (HDP) deposition or a spin on glass (SOG) technique.

In step 314, the chemical-mechanical polishing (CMP) process or the etch back process is applied to planarize the dielectric structure 46, wherein the dielectric structure 46 is processed until exposing the dielectric portion 54. Utilizing step 314, the dielectric structure 46 has a planarized structure 56 remained. As a result, the top surface of the dielectric portion 54 may be aligned with a top surface of the planarized structure 56. For instance, the planarized structure 56 is filled in the trench structure 45, and is coupled to the dielectric portion 54, the conductive portion 53 (being a conductive layer) and the dielectric portion 52.

In step 316, the planarized structure 56 is etched back or processed by the CMP to remove a portion of thereof with a removed thickness being larger than the thickness of the dielectric portion 54 to cause the planarized structure 56 to have a dielectric layer 66 (being a dielectric structure) remained. For instance, step 316 is performed by one of a dilute HF clean process and a dry etching process. For instance, the dielectric layer 66 has a top surface being lower than a top surface of the conductive portion 53 by a specific distance.

In step 318, the dielectric portion 54 is removed, and a top edge portion 53E of the conductive portion 53 can be removed simultaneously to cause the conductive portion 53 to have a conductive layer 63 (being a conductive portion or a conductive structure) remained. The conductive layer 63 includes a top portion 631, wherein the top portion 631 of the conductive layer 63 may have a sub-portion 632, and the sub-portion 632 has an exposed edge-trimmed surface 633. For instance, the top edge portion 53E of the conductive portion 53 is removed to form the exposed edge-trimmed surface 633, and step 318 is performed by using a hot H3PO4 clean process.

In step 320, the sub-portion 632 is transformed into an oxide layer 47 to convert the top portion 631 into a top portion 731 by applying a low temperature oxidation process to the exposed edge-trimmed surface 633, wherein the oxide layer 47 covers the top portion 731. For instance, the low temperature oxidation process is one selected from a group consisting of a low temperature plasma oxidation process, a radical oxide process and an ozone clean process.

In step 322, the oxide layer 47 is removed and a portion of the dielectric layer 66 is removed with a removed thickness related to the thickness of the conductive portion 53 to convert the top portion 731 into a top portion 831 and cause the dielectric layer 66 and the conductive layer 63 to respectively have a dielectric portion 76 and a conductive layer 83 remained, wherein the conductive layer 83 has the top portion 831, and the top portion 831 is exposed and has a domed surface 832. For instance, step 322 is performed by using a dilute HF clean process. For instance, the dielectric portion 76 has a top surface being higher than a top surface of the dielectric portion 52 by a specific distance.

In step 324, a dielectric layer 48 is formed on the dielectric portion 76 and the top portion 831 of the conductive layer 83. For instance, the dielectric layer 48 is an oxide-nitride-oxide (ONO) layer deposited on the dielectric portion 76 and the top portion 831 of the conductive layer 83. In step 326, a conductive layer 49 is formed on the dielectric layer 48 to form the nonvolatile memory device. For instance, the conductive layer 49 is a polysilicon layer, and the dielectric layer 48 is an inter-poly dielectric layer. For instance, the conductive layer 49 is a control-gate layer of the nonvolatile memory device.

Please refer to FIG. 2A, FIG. 2B, FIG. 2C, FIG. 2D, FIG. 2E and FIG. 2F, which are schematic diagrams showing the method 300 for making nonvolatile memory device 91 according to one embodiment of the present invention. In FIGS. 2A-2F, the nonvolatile memory device 91 includes two nonvolatile memory devices 91A and 91B, such as two floating-gate nonvolatile memory cells. For the following description, one of the nonvolatile memory devices 91A and 91B will be referred although the discussion will refer to each. For instance, the nonvolatile memory device 91A is one of an NAND floating-gate memory device and an NOR floating-gate memory device.

Figure 2A:
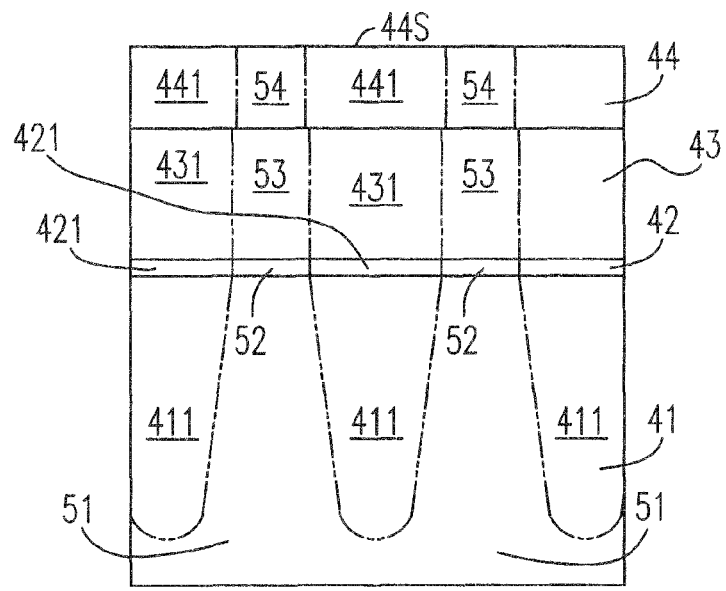
FIG. 2A, FIG. 2B, FIG. 2C, FIG. 2D, FIG. 2E and FIG. 2F are schematic diagrams showing the method for making nonvolatile memory device according to one embodiment of the present invention.

In FIG. 2A, the substrate 41 has been provided and includes a substrate portion 411 and a substrate portion 51. For instance, the substrate 41 is a semiconductor substrate, such as a silicon substrate. The dielectric layer 42 has been formed on the substrate 41 and includes two dielectric portions 421 and 52. For instance, the dielectric layer 42 is an oxide layer, such as a SiO2 layer. The conductive layer 43 has been formed on the dielectric layer 42 and includes two conductive portions 431 and 53. For instance, the conductive layer 43 is a polysilicon layer. The dielectric layer 44 has been formed on the conductive layer 43 and includes two dielectric portions 441 and 54. For instance, the dielectric layer 44 is a hard mask layer and has a top surface 44S. The dielectric layer 44 may be a Si3N4 layer.

Figure 2B:
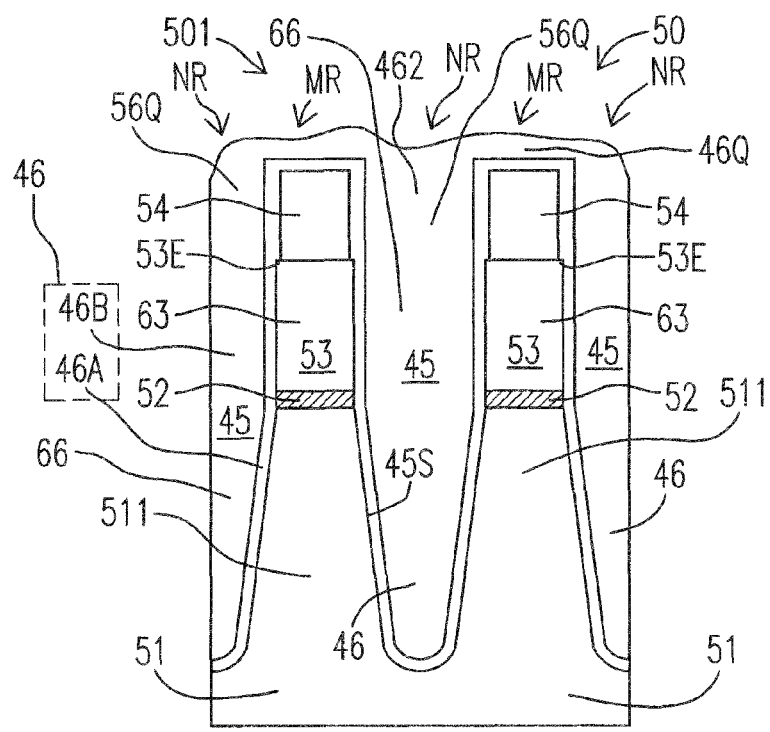

In FIG. 2B, the trench structure 45 has been formed by removing the dielectric portion 441, the conductive portion 431, the dielectric portion 421 and the substrate portion 411 to have the dielectric portion 54, the conductive portion 53, the dielectric portion 52 and the substrate portion 51 remained. The trench structure 45 extends downward from the top surface 44S of the dielectric layer 44 through the dielectric layer 44, the conductive layer 43 and the dielectric layer 42 into the substrate 41. For instance, the self-aligned shallow trench isolation (SA-STI) process has been applied for forming the trench structure 45. For instance, the dielectric portion 54 and the conductive portion 53 (being a conductive layer) may serve as a mask layer and a floating-gate layer, respectively. The dielectric portion 52 and the substrate portion 51 may form a tunnel layer and a substrate of the nonvolatile memory device 91A, respectively.

The dielectric layer 44 is configured to have a masked region MR and a non-masked region NR on the dielectric layer 44. The SA-STI process forms the trench structure 45 in the non-masked region NR. The trench structure 45 is used to separate nonvolatile memory device regions. For instance, the top portion 511 of the substrate portion 51, the dielectric portion 52 and the conductive portion 53 are in alignment.

In FIG. 2B, the dielectric structure 46 has been formed to fill the trench structure 45 and form a transistor workpiece 50, and serves as a filler dielectric. In one implementation, the dielectric structure 46 is an oxide structure and includes a liner oxide layer 46A and a filler oxide 46B; the liner oxide layer 46A is deposited on the surface 45S of the trench structure 45 by an in-situ steam growth (ISSG) or a thermal process, and then the filler oxide 46B is formed on the liner oxide layer 46A to fill the trench structure 45. In one implementation, the dielectric structure 46 includes the filler oxide 462, and the filler oxide 462 is formed on the surface 45S of the trench structure 45 to fill the trench structure 45. For instance, the filler oxide 462 is formed by employing a high density plasma (HDP) deposition or a spin on glass (SOG) technique. For instance, the dielectric structure 46 includes a dielectric portion 46Q, a dielectric portion 56Q and a dielectric layer 66.

For instance, the transistor workpiece 50 may include the substrate portion 51, the dielectric portion 52 and a dielectric module 501, wherein the dielectric portion 52 is disposed on the substrate portion 51, the conductive portion 53 is disposed in the transistor workpiece 50, and the dielectric module 501 is coupled to the substrate portion 51, the dielectric portion 52 and the conductive portion 53. The dielectric module 501 includes the dielectric portion 54 and the dielectric structure 46, wherein the dielectric portion 54 is disposed on the conductive portion 53 (being a conductive layer) and under the dielectric structure 46, and the dielectric structure 46 is coupled to the dielectric portion 54, the conductive portion 53 and the dielectric portion 52. The conductive portion 53 includes a top edge portion 53E and a conductive layer 63 (being a conductive portion or a conductive structure), and is disposed on the dielectric portion 52 and under the dielectric module 501. For instance, the dielectric portion 54, the conductive portion 53 and the dielectric portion 52 is surrounded by the dielectric structure 46.

Figure 2C:
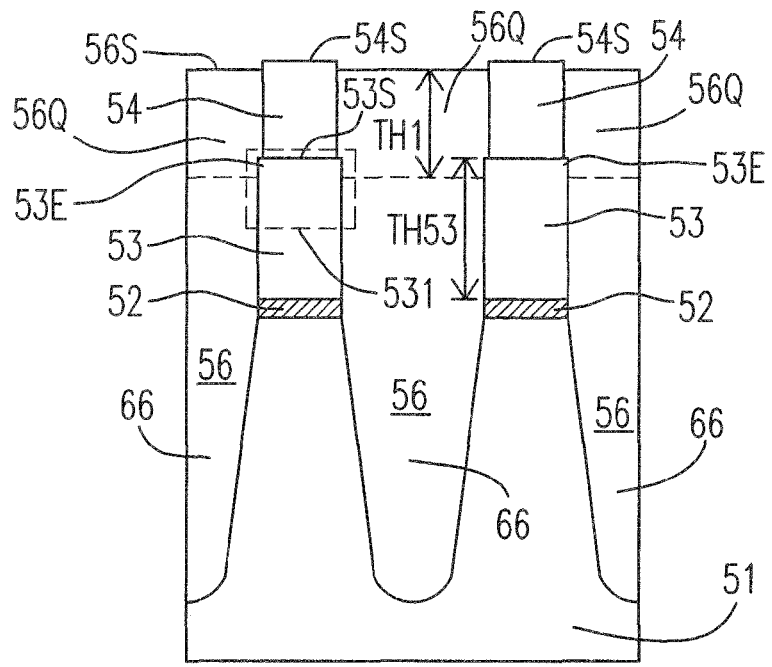

In FIG. 2C, the chemical-mechanical polishing (CMP) process or the etch back process has been applied to planarize the dielectric structure 46 and has been stopped by a top surface 54S of the dielectric portion 54. Therefore, the dielectric portion 46Q (shown in FIG. 2B) of the dielectric structure 46 may be removed to expose the dielectric portion 54 and cause the dielectric structure 46 to have a planarized structure 56 remained, and a transistor workpiece 50 has been formed, wherein the conductive portion 53 has been disposed in the transistor workpiece 50, and has a top surface 53S and a thickness TH53. The planarized structure 56 includes the dielectric portion 56Q having a removed thickness TH1 and the dielectric layer 66, and the top surface 54S of the mask layer 54 may be aligned with a top surface 56S of the planarized structure 56.

Figure 2D:
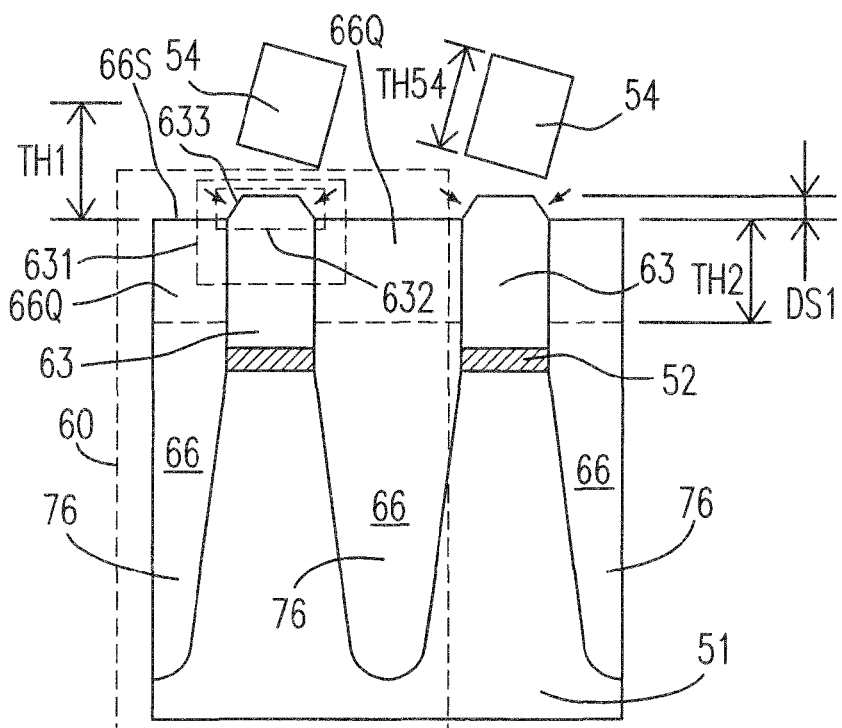

In FIG. 2D, the planarized structure 56 has been etched back or processed by the CMP to remove the dielectric portion 56Q of thereof with the removed thickness TH1 being larger than the thickness TH54 of the dielectric portion 54 and cause the planarized structure 56 to have the dielectric layer 66 (being a dielectric structure) remained. For instance, the dielectric portion 56Q of the planarized structure 56 has been removed by one of a dilute HF clean process and a dry etching process. For instance, the dielectric layer 66 has a top surface 66S being lower than the top surface 53S of the conductive portion 53 by a specific distance DS1. The dielectric layer 66 includes two dielectric portions 66Q and 76, wherein the dielectric portion 66Q has a removed thickness TH2.

In FIG. 2D, the dielectric portion 54 has been removed, and the top edge portion 53E (shown in FIG. 2B) of the conductive portion 53 can be removed simultaneously to have the conductive layer 63 (being a conductive portion or a conductive structure) of the conductive portion 53 remained and form a workpiece 60. The conductive layer 63 includes a top portion 631, wherein the top portion 631 of the conductive layer 63 may have a sub-portion 632, and the sub-portion 632 has an exposed edge-trimmed surface 633. For instance, the top edge portion 53E is removed to form the exposed edge-trimmed surface 633, and the hot H3PO4 clean process has been used to remove the dielectric portion 54 and the conductive portion 53.

For instance, the workpiece 60 may include the substrate portion 51, the dielectric portion 52, the conductive layer 63 and the dielectric layer 66. The dielectric layer 66 includes dielectric portions 66Q and 76, is disposed on the substrate portion 51, and is coupled to the dielectric portion 52 and the conductive layer 63. For instance, the dielectric portion 52 and the conductive layer 63 are surrounded by the dielectric layer 66.

Figure 2E:
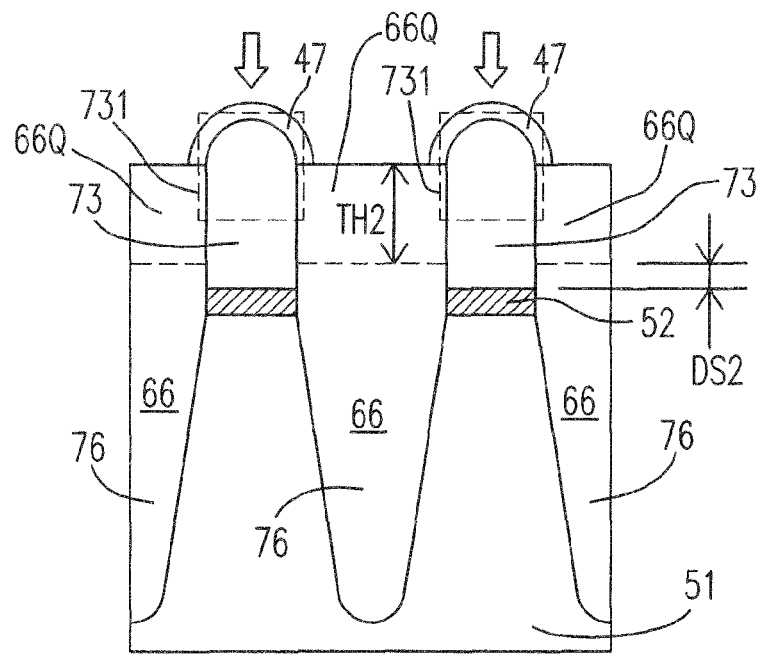

In FIG. 2E, the sub-portion 632 has been transformed into an oxide layer 47 to convert the top portion 631 into a top portion 731 by applying a low temperature oxidation process to the exposed edge-trimmed surface 633, wherein the oxide layer 47 covers the top portion 731. For instance, the low temperature oxidation process is one selected from a group consisting of a low temperature plasma oxidation process, a radical oxide process and an ozone clean process.

For instance, the temperature of the conductive layer 63 during the low temperature plasma oxidation process is within a range between 600° C. and 700° C., the temperature of the conductive layer 63 during the radical oxide process is within a range between 600° C. and 700° C., and the temperature of the conductive layer 63 during the ozone clean process is within a range between 400° C. and 500° C. For instance, the low temperature oxidation process includes an isotropic oxidation process, the top portion 631 of the conductive layer 63 further has damage on the exposed edge-trimmed surface 633, and the damage on the exposed edge-trimmed surface 633 is fixed during the low temperature oxidation process.

Figure 2F:
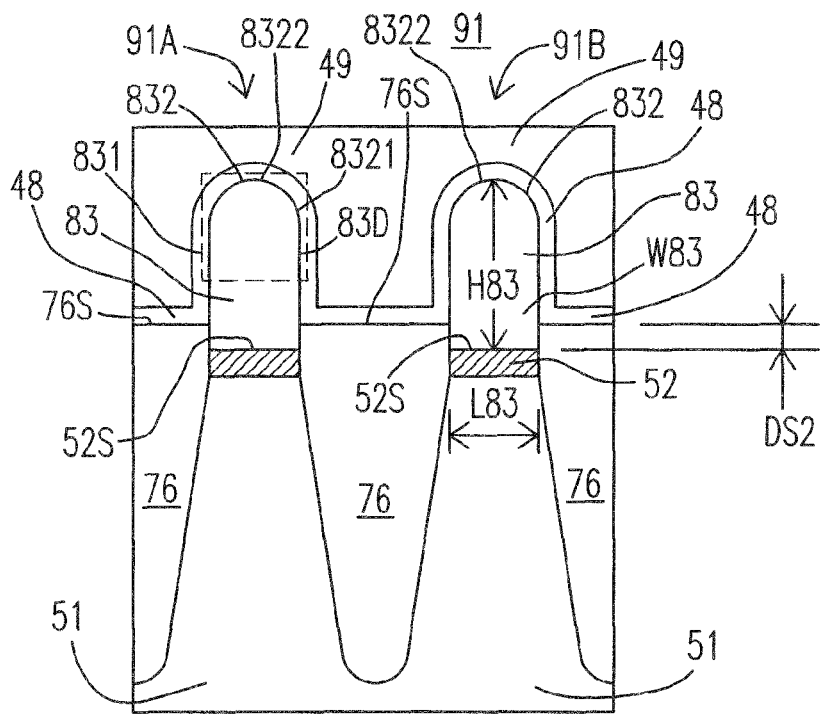

In FIG. 2F, the oxide layer 47 has been removed and the dielectric portion 66Q (shown in FIG. 2E) of the dielectric layer 66 has been removed with the removed thickness TH2 related to the thickness TH53 (shown in FIG. 2C) of the conductive portion 53 to convert the top portion 731 into a top portion 831 and cause the conductive layer 63 and the dielectric layer 66 to respectively have a conductive layer 83 and the dielectric portion 76 remained, wherein the conductive layer 83 has the top portion 831, and the top portion 831 is exposed and has a domed surface 832. For instance, a dilute HF clean process has been used to remove the oxide layer 47 and the dielectric portion 66Q of the dielectric layer 66. For instance, the dielectric portion 76 has a top surface 76S being higher than a top surface 52S of the dielectric portion 52 by a specific distance DS2, and forms a trench isolation layer of the nonvolatile memory device 91A.

For instance, the top portion 631 of the conductive layer 63 has a first front-view cap profile, the top portion 831 of the conductive layer 83 has a second front-view cap profile, the first and the second front-view cap profiles have a first minimum fitted curvature radius and a second minimum fitted curvature radius, respectively, and the first minimum fitted curvature radius is smaller than the second minimum fitted curvature radius. For instance, the domed surface 832 has a bottom portion 8321 and a top portion 8322 coupled to the bottom portion 8321, and the top portion 8322 forms a round tip (or a dome). The conductive layer 83 further has a side surface 83D, and the bottom portion 8321 smoothly extends to the side surface 83D and the top portion 8322. For instance, the conductive layer 83 has a length L83, a width W83 (in the direction perpendicular to the sheet) and a height H83, wherein the height H83 is larger than the length L83, and/or the height H83 is larger than the width W83, or the height H83 is larger than the lateral width of the conductive layer 83.

In FIG. 2F, a dielectric layer 48 has been formed on the dielectric portion 76 and the top portion 831 of the conductive layer 83. For instance, the dielectric layer 48 is an oxide-nitride-oxide (ONO) layer deposited on the dielectric portion 76 and the top portion 831.

In FIG. 2F, a conductive layer 49 has been formed on the dielectric layer 48 to form the nonvolatile memory device 91A. For instance, the conductive layer 49 is a polysilicon layer, and the dielectric layer 48 is an inter-poly dielectric layer. For instance, the conductive layer 83 and the conductive layer 49 form a floating-gate layer and a control-gate layer of the nonvolatile memory device 91A, respectively.

Figure 2G:
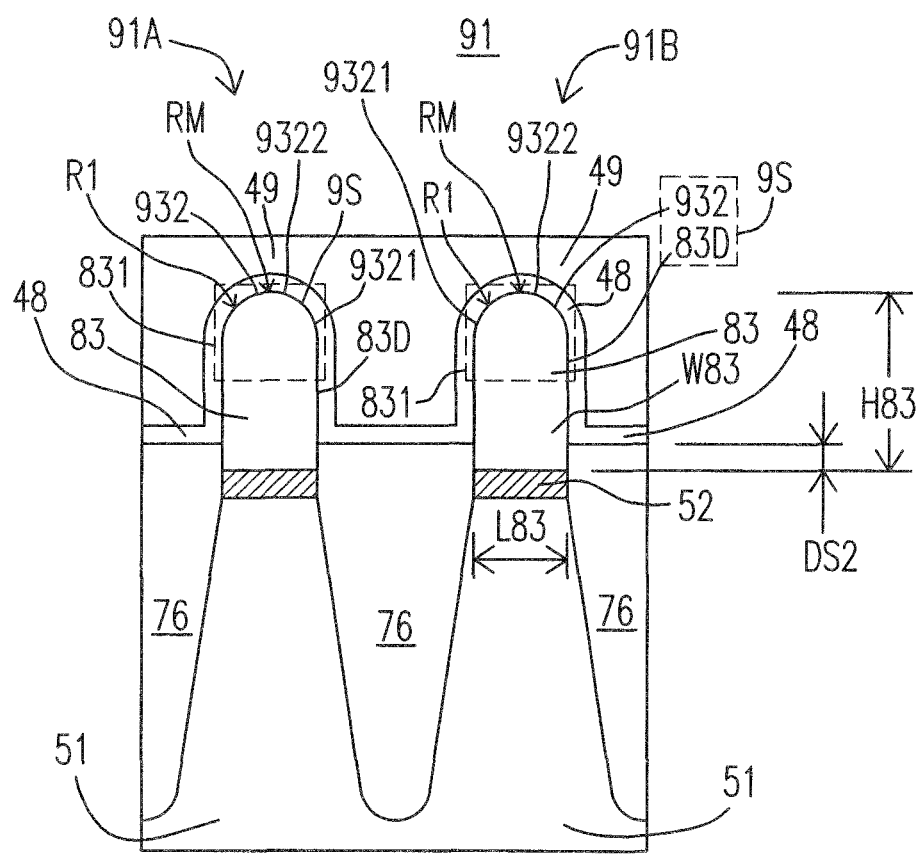
FIG. 2G is a schematic diagram showing an alternative configuration for the configuration in FIG. 2F according to one embodiment of the present invention.

Please refer to FIG. 2G, which is a schematic diagram showing an alternative configuration for the configuration in FIG. 2F according to one embodiment of the present invention. The components with the same numerals in FIG. 2F and FIG. 2G have similar functions. As shown in FIG. 2G, the top portion 831 of the conductive layer 83 has a top surface 932, wherein the top surface 932 has a minimum fitted curvature radius RM being finite. For instance, the conductive layer 83 further has a surface 9S and a fitted curvature radius distribution R1 in the surface 9S, wherein the surface 9S includes the top surface 932 and a side surface 83D coupled to the top surface 932. The fitted curvature radius distribution R1 has the minimum fitted curvature radius RM in the top surface 932. For instance, the top surface 932 and the side surface 83D has an inverted U-shaped cross-section.

For instance, the top surface 932 is a domed surface and smoothly extends to the side surface 83D. The top surface 932 is made by a method the same as that making the domed surface 832. For instance, the top surface 932 has a bottom portion 9321 and a top portion 9322 coupled to the bottom portion 9321, and the top portion 9322 may form a round tip (or a dome). The bottom portion 8321 smoothly extends to the side surface 83D and the top portion 8322.

For instance, as continuing to scale the size of the NAND memory cell, a higher electric field is induced on the top edges of the floating-gate layer through inter-poly dielectric layer during the programming operation due to the smaller curvature radius on the top edges of the floating-gate layer, the thinner inter-poly dielectric layer, and the smaller coupling ratio. To overcome this issue, the floating-gate layer (such as the conductive layer 83) with a round tip is provided for the NAND flash memory cell, wherein the round tip has a large curvature radius. For instance, a low temperature oxidation process, providing a lower thermal budget process, modulates the round tip, and does not have any influence on the cell doping profile of the self-aligned shallow trench isolation.

In one embodiment, a method for making a nonvolatile memory device 91A is provided according to FIGS. 2A-2G and includes the following steps. A conductive structure (such as the conductive layer 63) is formed, wherein the conductive structure has a top portion 631. In addition, the top portion 631 is converted into a top portion 831 having a domed surface 832. For instance, the method further includes a step of forming a workpiece 60, wherein the workpiece may include the substrate portion 51, the dielectric portion 52, the conductive structure (such as the conductive layer 63) and a dielectric structure (such as the dielectric layer 66). The dielectric portion 52 is disposed on the substrate portion 51, the conductive structure is disposed on the dielectric portion 52, and the dielectric structure (such as dielectric layer 66) is disposed on the substrate portion 51 and coupled to the dielectric portion 52 and the conductive structure.

In one embodiment, a method for making a nonvolatile memory device 91A is provided according to FIGS. 2A-2G and includes the following steps. A transistor workpiece 50 and a conductive layer (such as the conductive portion 53) disposed in the transistor workpiece 50 are formed. In addition, a top surface 932 of the conductive layer is formed, wherein the top surface 932 has a minimum fitted curvature radius RM being finite.

For instance, the top surface 932 further has a fitted curvature radius distribution R1 therein and a top portion 9322, and is formed by converting the transistor workpiece 50 and the conductive layer (such as the conductive portion 53), wherein the fitted curvature radius distribution R1 has the minimum fitted curvature radius RM in the top portion 9322. For instance, the top surface 932 is formed by removing a portion of the transistor workpiece 50 and a portion of the conductive layer, wherein the portion of the transistor workpiece 50 may include the dielectric portions 46Q, 54, 56Q and 66, and the portion of the conductive layer may include the top edge portion 53E and the sub-portion 632. For instance, the top surface 932 may be the domed surface 832.

Figure 3:
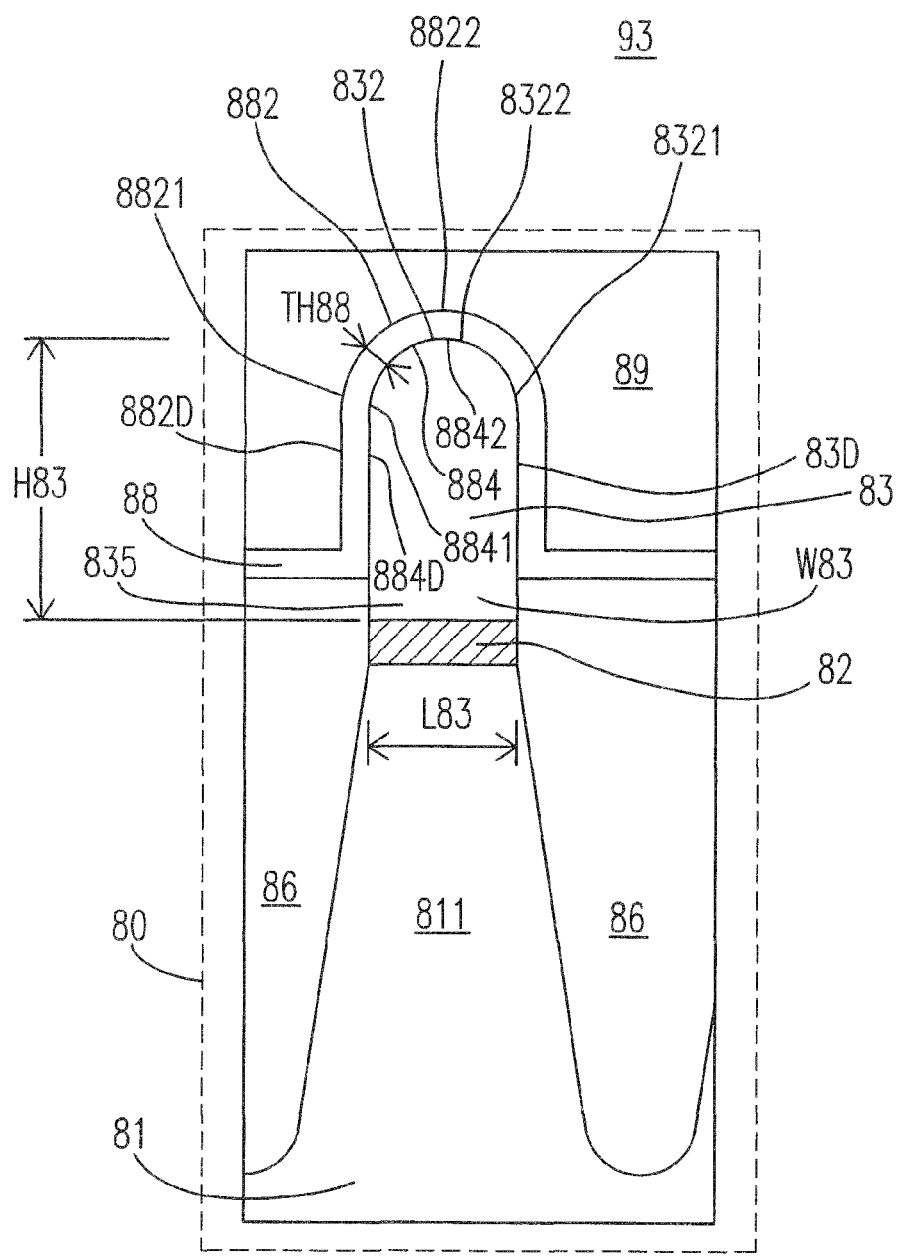
FIG. 3 is a schematic diagram showing a nonvolatile memory device according to one embodiment of the present invention.

Please refer to FIG. 3, which is a schematic diagram showing a nonvolatile memory device 93 according to one embodiment of the present invention. As shown, the nonvolatile memory device 93 includes a transistor structure 80 and a conductive layer 83. The conductive layer 83 is disposed in the transistor structure 80, and has a domed surface 832. For instance, the transistor structure 80 includes a substrate 81, a tunnel layer 82, a trench isolation layer 86, a conductive layer 89 (serving as a control-gate layer), and a dielectric layer 88. For instance, the conductive layer 83 serves as a floating-gate layer.

The substrate 81 includes a top portion 811. The tunnel layer 82 is disposed on the top portion 811 of the substrate 81, wherein the conductive layer 83 is disposed on the tunnel layer 82 and includes a bottom portion 835. The trench isolation layer 86 is coupled to the top portion 811, the tunnel layer 82 and the bottom portion 835. The dielectric layer 88 is disposed on the conductive layer 83 and the trench isolation layer 86. The conductive layer 89 is disposed on the dielectric layer 88. For instance, the top portion 811, the tunnel layer 82 and the bottom portion 835 are surrounded by the trench isolation layer 86, and the trench isolation layer 86 is disposed on the substrate 81.

For instance, the top portion 811, the tunnel layer 82 and the bottom portion 835 are in alignment. The conductive layer 83 may be a polysilicon floating-gate layer. For instance, the domed surface 832 has a bottom portion 8321 and a top portion 8322 coupled to the bottom portion 8321, and the top portion 8322 forms a round tip or a dome. The conductive layer 83 further has a side surface 83D, and the bottom portion 8321 smoothly extends to the side surface 83D and the top portion 8322. For instance, the floating-gate layer 83 has a length L83, a width W83 (in the direction perpendicular to the sheet) and a height H83, wherein the height H83 is larger than the length L83, and/or the height H83 is larger than the width W83, or the height H83 is larger than the lateral width of the conductive layer 83. For instance, the domed surface 832 is coupled to the side surface 83D, and domed surface 832 and the side surface 83D has an inverted U-shaped cross-section.

In one embodiment, the nonvolatile memory device 93 includes a conductive layer 89 (serving as a control-gate layer), a conductive layer 83 and a dielectric layer 88. The dielectric layer 88 is disposed between the conductive layer 89 and the conductive layer 83, and has an inner domed surface 884, wherein the inner domed surface 884 coincides with the domed surface 832. For instance, the dielectric layer 88 further has an outer domed surface 882, an inner side surface 884D and an outer side surface 882D, wherein the inner side surface 884D coincides with the side surface 83D. For instance, the dielectric layer 88 has a thickness TH88, and the outer domed surface 882 has a shape driven out from the inner domed surface 884 by the thickness TH88.

For instance, the inner domed surface 884 has a bottom portion 8841 and a top portion 8842 coupled to the bottom portion 8841, and the outer domed surface 882 has a bottom portion 8821 and a top portion 8822 coupled to the bottom portion 8821. The top portion 8842 forms an inner round tip, and the top portion 8822 forms an outer round tip. The bottom portion 8841 smoothly extends to the inner side surface 884D and the top portion 8842, and the bottom portion 8821 smoothly extends to the outer side surface 882D and the top portion 8822. For instance, the outer domed surface 882 is coupled to the outer side surface 882D, and outer domed surface 882 and the outer side surface 882D has an inverted U-shaped cross-section.

Figure 4:
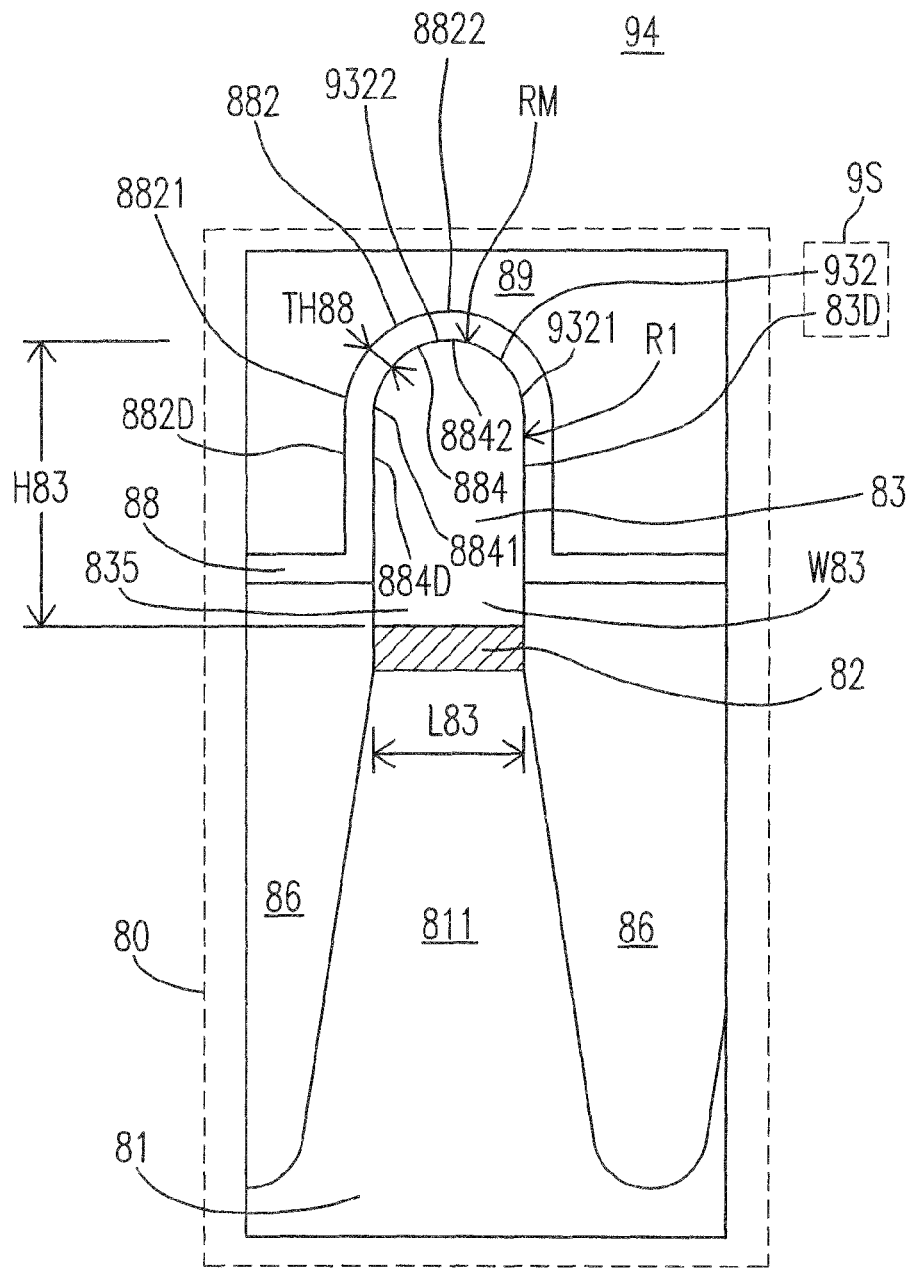
FIG. 4 is a schematic diagram showing another nonvolatile memory device according to one embodiment of the present invention.

Please refer to FIG. 4, which is a schematic diagram showing another nonvolatile memory device 94 according to one embodiment of the present invention. The components with the same numerals in FIG. 3 and FIG. 4 have similar functions. As shown in FIG. 4, the nonvolatile memory device 94 includes a transistor structure 80 and a conductive layer 83. The conductive layer 83 is disposed in the transistor structure 80, and has a top surface 932, wherein the top surface 932 has a minimum fitted curvature radius RM being finite. For instance, the transistor structure 80 includes a substrate 81, a tunnel layer 82, a trench isolation layer 86, a conductive layer 89, and a dielectric layer 88.

For instance, the conductive layer 83 further has a surface 9S and a fitted curvature radius distribution R1 in the surface 9S, wherein the surface 9S includes the top surface 932 and a side surface 83D coupled to the top surface 932. The fitted curvature radius distribution R1 has the minimum fitted curvature radius RM in the top surface 932. For instance, the top surface 932 and the side surface 83D has an inverted U-shaped cross-section. For instance, the top surface 932 is a domed surface and smoothly extends to the side surface 83D. For instance, the top surface 932 has a bottom portion 9321 and a top portion 9322 coupled to the bottom portion 9321, and the top portion 9322 may form a round tip (or a dome). The bottom portion 8321 smoothly extends to the side surface 83D and the top portion 8322.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for making a nonvolatile memory device, comprising steps of:
   forming a first conductive structure, wherein the first conductive structure has a first top portion;
   converting the first top portion into a second top portion having a domed surface;
   forming a workpiece, wherein the workpiece includes a first conductive layer with a thickness, a hard mask portion and a planarized dielectric structure, the hard mask portion is disposed on the first conductive layer, the first conductive layer includes a first top surface, a top edge conductive portion and the first conductive structure, the planarized dielectric structure includes a first dielectric portion and is coupled to the first conductive layer and the hard mask portion, and the first top portion has a sub-portion with an exposed edge-trimmed surface;
   exposing the top edge conductive portion and a remaining dielectric structure of the planarized dielectric structure by removing the first dielectric portion, wherein the remaining dielectric structure includes an exposed top surface and a second dielectric portion;
   exposing the first conductive structure being a remaining conductive structure by removing the hard mask portion on a condition that the exposed top surface remains to be lower than the first top surface for a specific distance less than the thickness and the hard mask portion is removed to simultaneously remove the top edge conductive portion;
   transforming the sub-portion into a first oxide layer for converting the first top portion into a third top portion by applying a low temperature oxidation process to the exposed edge-trimmed surface, wherein the first oxide layer covers the third top portion; and
   converting the third top portion into the second top portion by removing the first oxide layer and the second dielectric portion.

2. The nonvolatile memory device making method according to claim 1, wherein the step of forming the workpiece comprises steps of:
   providing a substrate;
   forming a first dielectric layer over the substrate;
   forming a second conductive layer over the first dielectric layer;
   forming a second dielectric layer being a hard mask layer on the first conductive layer;
   patterning the second dielectric layer, the second conductive layer, the first dielectric layer and the substrate to form a remaining second dielectric layer, a remaining second conductive layer, a remaining first dielectric layer, and a trench structure, wherein the remaining second conductive layer is the first conductive layer, and the remaining second dielectric layer is the hard mask portion;
   filling the trench structure with a first dielectric structure;
   planarizing the first dielectric structure to form the workpiece.

3. The nonvolatile memory device making method according to claim 2, wherein the step of planarizing the first dielectric structure is performed by a chemical-mechanical polishing process or an etch back process.

4. The nonvolatile memory device making method according to claim 1, wherein the step of removing the first dielectric portion is performed by one of a dilute HF clean process and a dry etching process.

5. The nonvolatile memory device making method according to claim 1, wherein the step of removing the hard mask portion is performed by using a hot $H_3PO_4$ clean process.

6. The nonvolatile memory device making method according to claim 1, wherein the first top portion has a first front-view cap profile, the second top portion has a second front-view cap profile, the first and the second front-view cap profiles have a first minimum fitted curvature radius and a second minimum fitted curvature radius, respectively, and the first minimum fitted curvature radius is smaller than the second minimum fitted curvature radius.

7. The nonvolatile memory device making method according to claim 1, wherein the low temperature oxidation process includes an isotropic oxidation process, the first top portion further has damage on the exposed edge-trimmed surface, and the step of transforming the sub-portion comprises a step of fixing the damage.

8. The nonvolatile memory device making method according to claim 1, wherein the first oxide layer and the second dielectric portion are removed to form a remaining dielectric portion of the remaining dielectric structure, and the nonvolatile memory device making method further comprises steps of:
   forming a first dielectric layer over the second top portion and the remaining dielectric portion; and
   forming a second conductive layer over the first dielectric layer.

9. The nonvolatile memory device making method according to claim 1, wherein a material of the planarized dielectric structure includes oxides, and the low temperature oxidation process includes one selected from a group consisting of a low temperature plasma oxidation process, a radical oxide process and an ozone clean process.

10. A method for making a nonvolatile memory device, comprising steps of:
- forming a transistor workpiece and a first conductive layer of a thickness disposed in the transistor workpiece, wherein the first conductive layer includes a first top surface, a top edge conductive portion and a first conductive portion, the transistor workpiece includes a hard mask portion and a first dielectric structure, the hard mask portion is disposed on the first conductive layer, and the first dielectric structure includes a first dielectric portion and is coupled to the hard mask portion and the first conductive layer;
- forming a second top surface of the first conductive layer, wherein the second top surface has a minimum fitted curvature radius being finite;
- exposing the top edge conductive portion and a remaining dielectric structure of the first dielectric structure by removing the first dielectric portion, wherein the remaining dielectric structure includes an exposed top surface and a second dielectric portion;
- exposing the first conductive portion being a remaining conductive portion by removing the hard mask portion on a condition that the exposed top surface remains to be lower than the first top surface for a specific distance less than the thickness and the hard mask portion is removed to simultaneously remove the top edge conductive portion, wherein the remaining conductive portion has a first top portion, and the first top portion has a sub-portion with an exposed edge-trimmed surface;
- transforming the sub-portion into a first oxide layer to convert the first top portion into a second top portion by applying a low temperature oxidation process to the exposed edge-trimmed surface, wherein the first oxide layer covers the second top portion; and
- converting the second top portion into a third top portion by removing the first oxide layer and the second dielectric portion, wherein the third top portion has the top surface.

11. The nonvolatile memory device making method according to claim 10, wherein the step of forming the transistor workpiece comprises steps of:
- providing a substrate, wherein the substrate includes a substrate portion;
- forming a first dielectric layer over the substrate, wherein the first dielectric layer includes a third dielectric portion;
- forming a second conductive layer over the first dielectric layer, wherein the second conductive layer includes a second conductive portion and the first conductive layer;
- forming a second dielectric layer being a hard mask layer on the second conductive layer, wherein the second dielectric layer includes a fourth dielectric portion and a fifth dielectric portion;
- forming a trench structure by removing the fourth dielectric portion, the second conductive portion, the third dielectric portion and the substrate portion to have the fifth dielectric portion of the second dielectric layer and the first conductive layer of the conductive layer remained, wherein the fifth dielectric portion is the hard mask portion; and
- filling the trench structure with the first dielectric structure to form the transistor workpiece.

* * * * *